(12) United States Patent
Buck et al.

(10) Patent No.: US 8,768,679 B2
(45) Date of Patent: Jul. 1, 2014

(54) SYSTEM AND METHOD FOR EFFICIENT MODELING OF NPSKEW EFFECTS ON STATIC TIMING TESTS

(75) Inventors: Nathan C. Buck, Underhill, VT (US); Brian M. Dreibelbis, Underhill, VT (US); John P. Dubuque, Jericho, VT (US); Eric A. Foreman, Fairfax, VT (US); Peter A. Habitz, Hinesburg, VT (US); Jeffrey G. Hemmett, Bolton Valley, VT (US); Natesan Venkateswaran, Hopewell Junction, NY (US); Chandramouli Visweswariah, Yorktown Heights, NY (US); Xiaoyue X. Wang, Ontario (CA)

(73) Assignee: International Business Machines Corporation, Armonk, NY (US)

( * ) Notice: Subject to any disclaimer, the term of this patent is extended or adjusted under 35 U.S.C. 154(b) by 944 days.

(21) Appl. No.: 12/894,286

(22) Filed: Sep. 30, 2010

(65) Prior Publication Data

US 2012/0084066 A1    Apr. 5, 2012

(51) Int. Cl.
     *G06F 17/50*      (2006.01)
     *G06F 7/60*      (2006.01)
     *G06F 13/10*      (2006.01)
     *G06F 11/26*      (2006.01)

(52) U.S. Cl.
     CPC ............ *G06F 13/105* (2013.01); *G06F 11/261* (2013.01); *G06F 17/50* (2013.01)
     USPC .................. 703/19; 703/13; 703/14; 703/15; 703/16; 703/17; 703/18; 703/20; 703/21

(58) Field of Classification Search
None
See application file for complete search history.

(56) References Cited

U.S. PATENT DOCUMENTS

| | | | | |
|---|---|---|---|---|
| 5,013,940 A | * | 5/1991 | Ansel | 326/27 |
| 5,568,081 A | * | 10/1996 | Lui et al. | 327/380 |
| 5,796,624 A | * | 8/1998 | Sridhar et al. | 703/14 |
| 5,896,399 A | * | 4/1999 | Lattimore et al. | 714/721 |
| 5,994,924 A | * | 11/1999 | Lee et al. | 326/93 |
| 6,069,509 A | * | 5/2000 | Labram | 327/170 |
| 6,133,757 A | * | 10/2000 | Huang et al. | 326/87 |
| 6,229,336 B1 | * | 5/2001 | Felton et al. | 326/38 |

(Continued)

OTHER PUBLICATIONS

Zanella et al. "Analysis of the Impact of Process Variations on Clock Skew", IEEE Transactions on Semiconductor Manufacturing, vol. 13, No. 4, Nov. 2000.*

(Continued)

*Primary Examiner* — Shambhavi Patel
(74) *Attorney, Agent, or Firm* — Gibb & Riley, LLC; Richard M. Kotulak, Esq.

(57) ABSTRACT

A computer-implemented method that simulates NPskew effects on a combination NFET (Negative Field Effect Transistor)/PFET (Positive Field Effect Transistor) semiconductor device using slew perturbations includes performing a timing test by a computing device, by: (1) evaluating perturb slews in Strong N/Weak P directions on the combination semiconductor device for a timing test result; (2) evaluation perturb slews in Weak N/Strong P directions on the combination semiconductor device for a timing test result; and (3) evaluating unperturbed slews in a balanced condition on the combination semiconductor device for a timing test result. After each test is performed, a determination is made as to which evaluation of the perturbed and unperturbed slews produces a most conservative timing test result for the combination semiconductor device. An NPskew effect adjusted timing test result is finally output based on determining the most conservative timing test result.

21 Claims, 8 Drawing Sheets

(56) References Cited

U.S. PATENT DOCUMENTS

| | | | |
|---|---|---|---|
| 6,288,563 B1* | 9/2001 | Muljono et al. | 326/27 |
| 6,333,896 B1 | 12/2001 | Lee | |
| 6,476,652 B1 | 11/2002 | Lee et al. | |
| 6,543,038 B1 | 4/2003 | Tetelbaum | |
| 6,606,729 B2 | 8/2003 | Gross et al. | |
| 6,670,821 B2* | 12/2003 | Ajit | 326/32 |
| 6,789,219 B2 | 9/2004 | Hapke et al. | |
| 6,816,824 B2* | 11/2004 | Chuang et al. | 703/14 |
| 6,842,058 B2* | 1/2005 | McNitt et al. | 327/170 |
| 6,844,755 B2* | 1/2005 | Ajit | 326/32 |
| 6,901,570 B2 | 5/2005 | Lu | |
| 7,114,136 B2* | 9/2006 | Chase et al. | 324/501 |
| 7,295,639 B1 | 11/2007 | Cory | |
| 7,432,730 B2* | 10/2008 | Bucossi et al. | 326/26 |
| 7,808,268 B2* | 10/2010 | Bucossi et al. | 326/26 |
| 8,375,343 B1* | 2/2013 | Tiwary et al. | 716/113 |
| 2003/0042953 A1* | 3/2003 | Shin | 327/170 |
| 2005/0195005 A1* | 9/2005 | Choi et al. | 327/170 |
| 2006/0197568 A1* | 9/2006 | Takagi | 327/170 |
| 2007/0103141 A1* | 5/2007 | Dixon et al. | 324/76.63 |
| 2008/0126061 A1* | 5/2008 | Hayes et al. | 703/14 |
| 2008/0216033 A1* | 9/2008 | Bucossi et al. | 716/6 |
| 2008/0284464 A1* | 11/2008 | Bucossi et al. | 326/26 |

OTHER PUBLICATIONS

Zuchowski et al. "Process and Environmental Variation Impacts on ASIC Timing", IEEE 2004.*

Tutuianu et al. "Driver Models for Timing and Noise Analysis", 2002.*

* cited by examiner

SYSTEM AND METHOD FOR EFFICIENT MODELING OF NPSKEW EFFECTS ON STATIC TIMING TESTS

BACKGROUND

1. Field of Invention

The disclosure relates generally to a system and method for static timing analysis for CMOS circuits, and more particularly to a system and method for adjustment of modeled pulse width variation as a function of N type and P type skew variation during static timing analysis.

2. Description of the Related Art

One dominant form of performance analysis used during integrated circuit (IC) design is static timing analysis (STA). STA is an important process by which one identifies any circuit races/hazards which could cause a chip to malfunction, verifies the operational speed of a chip, and identifies the paths which limit the operational speed. STA typically operates on a timing graph, in which nodes represent electrical nodes (e.g., circuit pins) at which signals may make transitions at various times, and edges, or "propagate segments," representing the delays of the circuits and/or wires connecting the nodes. Although it may report performance-limiting paths, typical STA methods do not actually operate on paths (of which there may be an exponentially large number), and instead use a "block-based" approach to compute and propagate forward signal arrival times reflecting the earliest and/or latest possible times that signal transitions can occur at nodes in the timing graph. As a result, STA is extremely efficient, allowing for rapid estimation of IC timing on very large designs as compared to other approaches (e.g. transient simulation).

An important aspect of STA is evaluation of timing tests, which are required to ensure timing constraints necessary for functional hardware are satisfied. Common examples of timing tests are setup tests (often represented in a timing graph as "test segments"), requiring that a data signal at an input of a flip-flop or other memory element becomes stable for some setup period before the clock signal transition that stores that data (i.e., that the latest possible data transition in a clock cycle occur at least the required setup period before the earliest possible clock transition for that cycle), and hold tests, requiring that a data signal at an input of a flip-flop or other memory element remain stable for some hold period before the clock signal transition that stores that data (i.e., that the earliest possible data transition in a clock cycle occur at least the required hold period after the latest possible clock transition for the preceding clock cycle). Pairs of paths along which early and late arrival times compared in a timing test are propagated are often referred to as racing paths. Another common example of a timing test is a pulse width test. This measures the amount of time a given digital signal remains 'high' or 'low' and compares this against some minimum time required for functional hardware. When a pulse width test is measuring the 'low' signal as opposed to 'high', it is also known as an inactive test. Yet another example of a timing test closely related to the pulse width test is a clock gating test. This occurs when a clock signal enters some timing element that 'gates', or enables and disables, the clock signal as a function of some control signal. The purpose of a gating test is to ensure that the control signal is sufficiently high or sufficiently low relative to the clock signal to prevent spurious signals which should be gated from leaking through.

Although STA is typically performed at a particular "corner," which is a specified combination of conditions such as voltage, temperature, and manufacturing process that affect delays of circuits on a chip, local variations in these and other parameters may cause variations in delays of similar circuits in different locations on a chip. A common way to account for this variation in STA is to compute minimum and maximum delays for circuits, using minimum (or fast) delays to determine early signal arrival times and maximum (or slow) delays to determine late signal arrival times.

Modeling sources of variation in the timing rules (model) is costly due to increased characterization, model storage overhead and increased timing analysis memory usage, increased run time, and many sources of variation contributing to this overhead.

BRIEF SUMMARY

An exemplary embodiment includes a computer-implemented method that simulates NPskew effects on a combination NFET (Negative Field Effect Transistor)/PFET (Positive Field Effect Transistor) semiconductor device using slew perturbations includes performing a timing test by a computing device, by: (1) evaluating perturb slews in Strong N/Weak P directions on the combination semiconductor device for a timing test result; (2) evaluating perturb slews in Weak N/Strong P directions on the combination semiconductor device for a timing test result; and (3) evaluating unperturbed slews in a balanced condition on the combination semiconductor device for a timing test result. After each test is performed, a determination is made as to which evaluation of the perturbed and unperturbed slews produces a most conservative timing test result for the combination semiconductor device. An NPskew effect adjusted timing test result is finally output based on determining the most conservative timing test result.

In another embodiment, a computer-implemented method that simulates NPskew effects on a combination NFET (Negative Field Effect Transistor)/PFET (Positive Field Effect Transistor) semiconductor device using slew perturbations, the method includes performing a timing test by: (1) evaluating perturb slews in Strong N/Weak P directions on the combination semiconductor device for a first timing test result; (2) evaluating perturb slews in Weak N/Strong P directions on the combination semiconductor device for a second timing test result; and (3) considering a balanced condition on the combination semiconductor device having a null (0) timing test result. Thereafter, a smallest solution is selected from the evaluated timing test result and the null (0) timing test result as a selected timing test result for the combination semiconductor device, and a NPskew effect is output based on the selecting.

An additional embodiment is a computer-implemented method that simulates NPskew effects on a combination NFET (Negative Field Effect Transistor)/PFET (Positive Field Effect Transistor) semiconductor device using slew perturbations, the method includes performing a timing test by a computer by evaluating, a slack adjust amount directly in a single perturbation difference equation on the combination semiconductor device for a slack adjust value, where: $P_1=P_2$; and $(SL_1:X_1)=(SL_2:X_2)$, where $P_1$ is a percentage of a total time of a first signal transition time to where a first arrival time on a first signal occurs along the first signal transition, defined relative to an end of the first signal transition, where $P_2$ is a percentage of a total time of a second signal transition time to where a second arrival time on a second signal occurs along the second signal transition, defined relative to a start of the second signal transition, where $SL_1$ is a first slew time on the first signal, defined as a first total transition time for the first signal, where $SL_2$ is a second slew time on the second signal, defined as a second total transition time for the second signal, where $X_1$ is one of a negatively signed perturbation value applied on the first slew time if the first signal transition is falling, and a positively signed perturbation value applied on the first slew time if the first signal transition is rising, where $X_1$ is equal to the product of the first slew time and one of a constant value, a derived variable adder value and a scalar value, and where $X_2$ is one of a negatively signed perturbation value applied on the second slew time if the second signal transition is falling, and a positively signed perturbation value applied on the second slew time if the second signal transition is rising, where $X_2$ is equal to the product of the second slew time and one of a constant value, a derived variable adder value and a scalar value.

Efficient approximation of variation where possible has a large benefit and NPskew variation may be efficiently approximated. Delay effects of NPskew tend to cancel along a path where the primary concern is local transitional effects. A critical local transitional effect is the evaluation of Pulse Width (PW) or Gating Tests (GT). These timing tests are functions of transition time (slew), where NPskew can result in an unbalanced variation in slews.

The embodiments herein teach an efficient method to model NPskew effects that provide a low-cost coverage of the dominant NPskew effects thereby reducing characterization and runtime overhead.

BRIEF DESCRIPTION OF THE SEVERAL VIEWS OF THE DRAWINGS

The foregoing and other exemplary purposes, aspects and advantages will be better understood from the following detailed description with reference to the drawings, in which.

DETAILED DESCRIPTION

Figure 1:
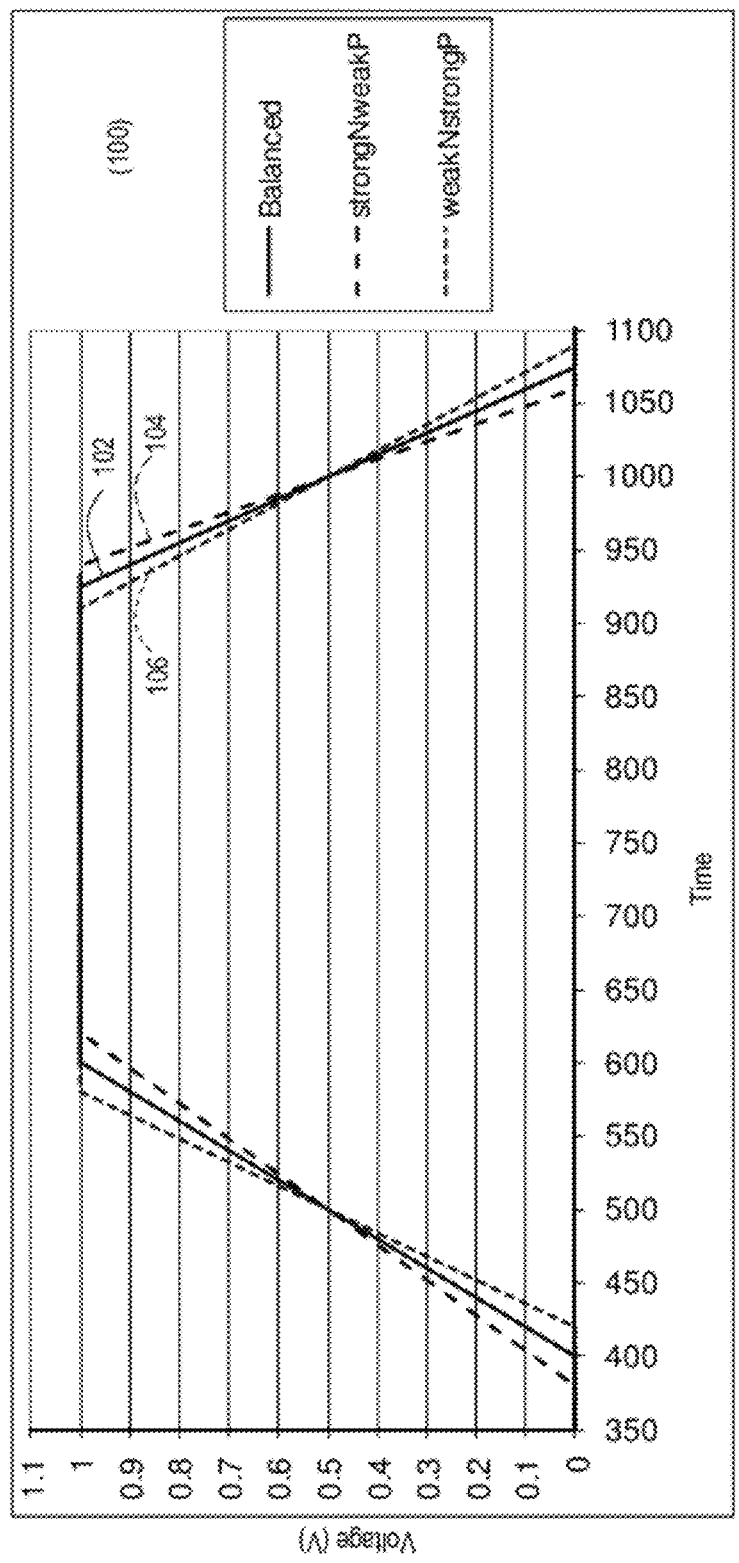
FIG. 1 illustrates a representative graph showing NPskew variability.

Referring now to the drawings, and more particularly to FIGS. 1-8, there are shown exemplary embodiments of the method of exemplary embodiments.

Referring to FIG. 1, NPskew variability is graphically illustrated and occurs in combination NFET (Negative Field Effect Transistor)/PFET (Positive Field Effect Transistor) semiconductor devices having both NFET and PFET semiconductors. NPskew variability occurs in opposing directions based on the type of FET semiconductor, i.e., a strong NFET/weak PFET, or a weak NFET/strong PFET. Where a strong NFET/weak PFET device is typified by a rising slew time from GND to VDD being greater than a falling slew time from VDD to GND relative to an otherwise balanced condition, and a weak NFET/strong PFET device is typified by a rising slew time from GND to VDD being less than a falling slew time from VDD to GND relative to an otherwise balanced condition. NPskew variability may exist on top of a shared threshold voltage (Vt) bias. NPskew variability can be an appreciable source of variation in integrated circuits, up to and sometimes exceeding a 10% variation from ideal design criteria. FIG. 1 demonstrates a graph 100 of a balanced signal 102, (where a balanced NFET/PFET device is typified by a rising slew time from GND to VDD being approximately equal to a falling slew time from VDD to GND), a strong NFET/weak PFET device signal 104, and a weak NFET/strong PFET device signal 106.

Slew perturbation values in embodiments herein are on a percentage basis, with separate rise/fall values. However, perturbation values may also include absolute perturbation amounts, a single rise/fall value, and may also differ in value by the perturbation direction, (e.g. a rising negative or positive perturbation). These values may be defined using simulation data, hardware measurements, engineering judgment, or some alternate method, wherein the goal is to define perturbation amounts that approximate typical levels of slew variation introduced by NPskew effects.

Figure 2:
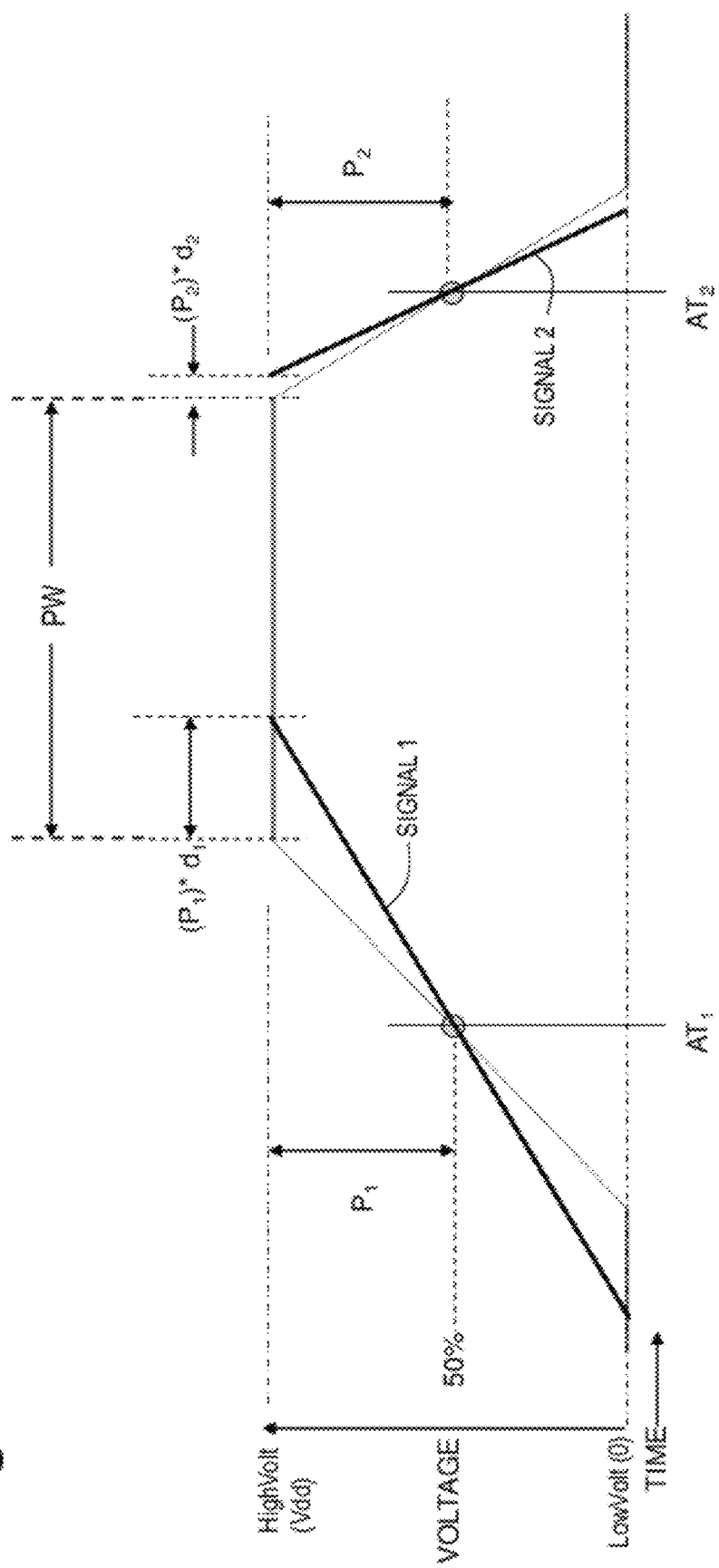
FIG. 2 illustrates a graphical representation of a change in pulse width as a function of NPskew.

FIG. 2 illustrates NPskew variability as a function of voltage and time where the pulse width (PW) modeling is defined as the time a signal remains at HighVolt. The change in PW, or $\Delta PW$, based on either the WeakN/StrongP, or the StrongN/WeakP situation as shown in FIG. 1, is defined as:

$$\Delta PW = [(P_1 * \delta_1) - (P_2 * \delta_2)],$$

where $P_1$ is the percentage from the end of transition on Signal 1, to the location of $AT_1$ along the Signal 1 transition;

where $P_2$ is the percentage from the start of transition on Signal 2, to the location of $AT_2$ along the Signal 2 transition;

where $P_1$ and $P_2$ in FIG. 2 are at a 50% level, that is, $P_1 = P_2 = 0.5$;

where $\delta$ is the slew perturbation amount, or the amount the Balanced condition slew time is adjusted to represent a strongN/weakP condition (that is, Slew(StrongN/WeakP)–Slew(Balanced)). The slew time represents the rising time from LowVolt to HighVolt for a rising transition, and the falling time from HighVolt to LowVolt for a falling transition;

where $AT_2$ is a 50 percent level between GND and VDD of the falling signal; and where $AT_1$ is a 50 percent level between GND and VDD of the rising signal.

The Pulse Width (PW) offset by the change in PW, or $\Delta PW$ may then be compared to some known allowable minimum pulse width that must be satisfied to ensure functional hardware. If found to be less than the minimum allowable value a timing constraint is violated, which must be fixed or explained before manufacture can safely proceed.

Figure 3:
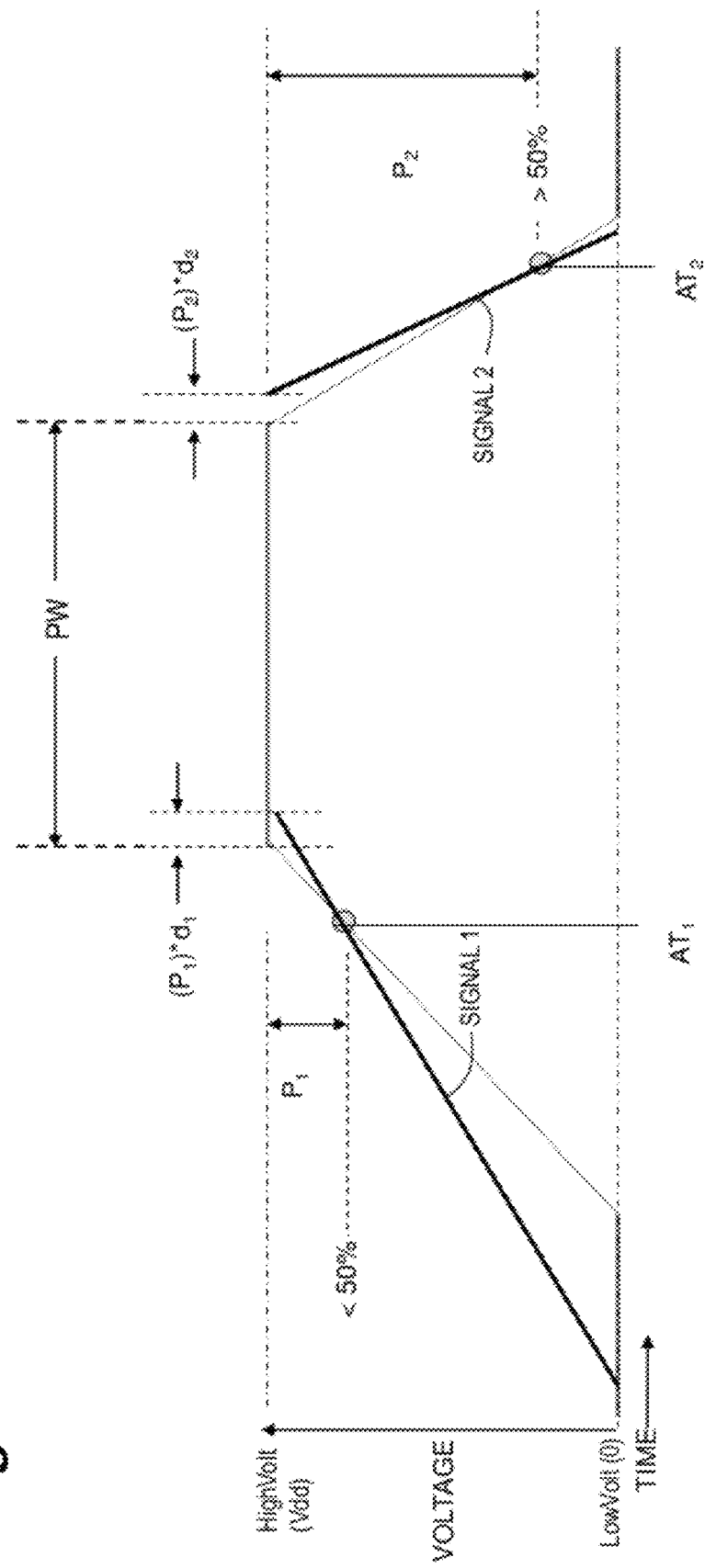
FIG. 3 illustrates a graphical representation of a change in pulse width as a function of NPskew.

FIG. 3 illustrates an alternative embodiment of determining $\Delta PW$ as in FIG. 2, except displaying an alternative definition of Arrival Time (AT), where the transition percentage $P_1$ for $AT_1$ is around 20% of HighVolt to LowVolt, and $P_2$ for $AT_2$ is around 80% of HighVolt to LowVolt. The NPskew modeling methods described herein may be generalized over any definition of Arrival Time, as demonstrated in FIG. 3. The percentages values, (e.g., $P_1 = 20\%$, $P_2 = 80\%$), shown are only representative, and in practice any percentage values may be utilized.

Figure 4:
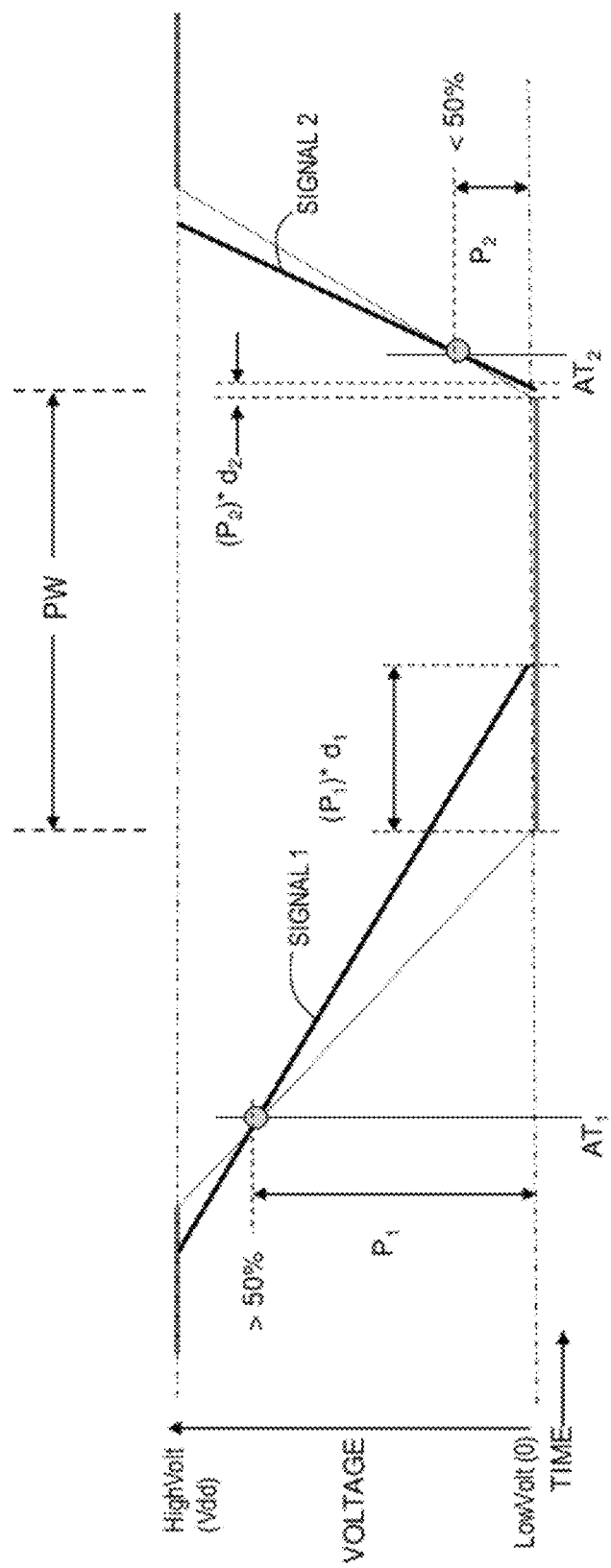
FIG. 4 illustrates a graphical representation of a change in pulse width as a function of NPskew.

FIG. 4 illustrates another alternative embodiment of determining $\Delta PW$ in a generalized Arrival Time definition environment. The embodiment in FIG. 4 shows NPskew variability as a function of voltage and time, as in FIG. 3, except for the case of the leading edge falling and the trailing edge rising (sometimes referred to as an 'Inactive' test, as opposed to the 'Pulsewidth' test of FIGS. 1-2). In this figure, $P_1$ is the percentage from the end of the transition on Signal 1 to the location of $AT_1$ on the Signal 1 transition and $P_2$ is the percentage from the start of the transition on Signal 2 to the location of $AT_2$ on the Signal 2 transition. As shown in FIG. 4, $P_1$ is around 80% of LowVolt to HighVolt and $P_2$ is around 20% of LowVolt to HighVolt, but these percentage values are purely representative, and in practice, any percentage values may be used.

Note how this definition of $P_1/P_2$ works for any test scenario (PW, Inactive, etc). FIG. 4 and FIGS. 2-3 have the same physical location for AT measure, but $P_1$ and $P_2$ flip as needed to track the required test type.

Figure 5A:
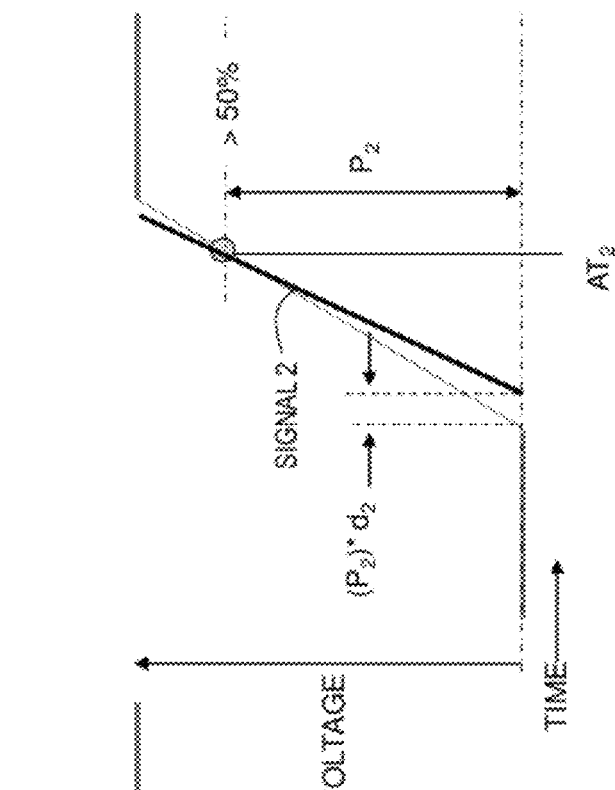
FIG. 5A illustrates a graphical representation of a change in pulse width as a function of NPskew.
Figure 5B:
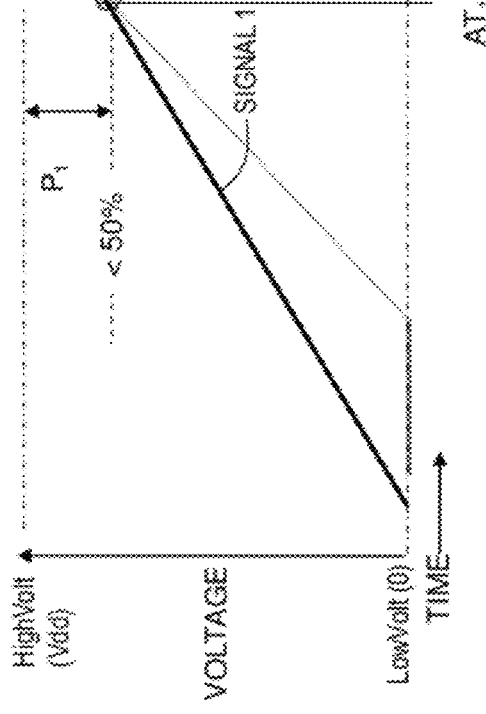
FIG. 5B illustrates a graphical representation of a change in pulse width as a function of NPskew.

FIGS. 5A and 5B illustrate the test situation where a check is made to compare two rising signals, for example, determining that Signal 1 has completed rising before Signal 2 starts rising. This case may also be presented for a test situation where a check is made to compare two falling signals in like fashion. In FIG. 5A, similar to the rising Signal 1 of FIG. 3, Signal 1 is compared to the rising Signal 2 of FIG. 5B where $P_1$ is the percentage from the end of the transition of Signal 1 to the location of $AT_1$ on the Signal 1 transition, and $P_2$ is the percentage from the start of the transition on Signal 2 to the location of AT2 on the Signal 2 transition. $P_1$ is around 20% of HighVolt to LowVolt, and $P_2$ is around 80% of LowVolt to HighVolt. As in the other figures, these percentage values, (e.g., $P_1$=20%, $P_2$=80%), are purely representative, and in practice any percentage values may be used.

Figure 6:
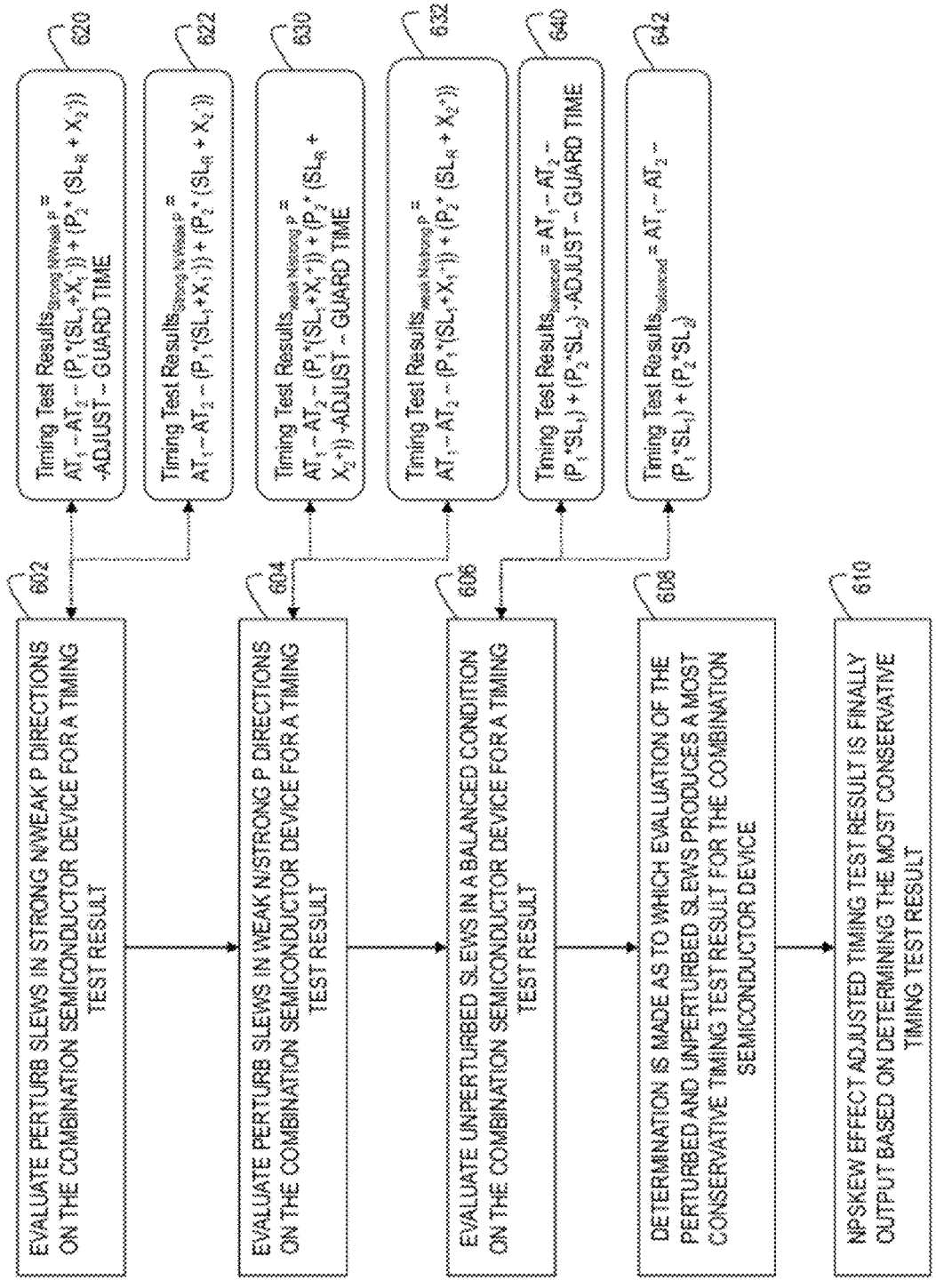
FIG. 6 illustrates a logic flowchart diagram of another embodiment.

FIG. 6 illustrates a logic flowchart diagram 600 of an embodiment for a full slack/brute force evaluation method that simulates NPskew effects on a combination NFET (Negative Field Effect Transistor)/PFET (Positive Field Effect Transistor) semiconductor device using slew perturbations includes performing timing test or slack evaluations, as a timing constraint. First, each of three timing test or slack evaluations of perturb slews must be made:

(1) evaluate perturbed slews in Strong N/Weak P directions on the combination semiconductor device for a timing test result 602, (wherein the timing test result may comprises a slack value);

(2) evaluate perturbed slews in Weak N/Strong P directions on the combination semiconductor device for a timing test result 604; and (3) evaluate unperturbed slews in a balanced condition on the combination semiconductor device for a timing test result 606.

After each test is performed, a determination is made as to which evaluation of the perturbed and unperturbed slews produces a most conservative timing test result for the combination semiconductor device 608. An NPskew effect adjusted timing test result is finally output based on determining the most conservative timing test result 610.

When evaluating perturb slews in Strong N/Weak P directions 602 the timing test result 620 is defined as:

$$[AT_1 - AT_2 - (P_1 * (SL_1 + X_1^-)) + (P_2 * (SL_2 + X_2^-)) - ADJUST - GUARD\ TIME],$$

where $AT_1$ is a first arrival time on a first signal,
where $AT_2$ is a second arrival time on a second signal,
where $P_1$ is a percentage of a total time of a first signal transition time to where $AT_1$ occurs along the first signal transition, defined relative to an end of the first signal transition,
where $P_2$ is a percentage of a total time of a second signal transition time to where $AT_2$ occurs along the second signal transition, defined relative to a start of the second signal transition,
where $SL_1$ is a first slew time on the first signal, defined as a first total transition time for the first signal,
where $SL_2$ is a second slew time on the second signal, defined as a second total transition time for the second signal,
where $X_1^-$ is one of a negatively signed perturbation value applied on the first slew time if the first signal transition is falling, and a positively signed perturbation value applied on the first slew time if the first signal transition is rising, where $X_1$ is equal to the product of the first slew time and one of a constant value, a derived variable adder value and a scalar value,
where $X_2^-$ is one of a negatively signed perturbation value applied on the second slew time if the second signal transition is falling, and a positively signed perturbation value applied on the second slew time if the second signal transition is rising, where $X_2$ is equal to the product of the second slew time and one of a constant value, a derived variable adder value and a scalar value,
where ADJUST is a signal adjust value; and
where GUARD TIME is a minimum allowable transition time.

When evaluating perturb slews in Weak N/Strong P directions the timing test result 630 is defined as:

$$[AT_1 - AT_2 - (P_1 * (SL_1 + X_1^+)) + (P_2 * (SL_2 + X_2^+)) - ADJUST - GUARD\ TIME],$$

where $AT_1$ is a first arrival time on a first signal,
where $AT_2$ is a second arrival time on a second signal,
where $P_1$ is a percentage of a total time of a first signal transition time to where $AT_1$ occurs along the first signal transition, defined relative to an end of the first signal transition,
where $P_2$ is a percentage of a total time of a second signal transition time to where $AT_2$ occurs along the second signal transition, defined relative to a start of the second signal transition,
where $SL_1$ is a first slew time on the first signal, defined as a first total transition time for the first signal,
where $SL_2$ is a second slew time on the second signal, defined as a second total transition time for the second signal,
where $X_1^+$ is one of a positively signed perturbation value applied on the first slew time if the first signal transition is falling, and a negatively signed perturbation value applied on the first slew time if the first transition is rising, where $X_1^+$ is equal to the product of the first slew time and one of a constant value, a derived variable adder value and a scalar value,
where $X_2^+$ is one of a positively signed perturbation value applied on the second slew time if the second signal transition is falling, and a negatively signed perturbation value applied on the second slew time if the second signal transition is rising, where $X_2^+$ is equal to the product of the second slew time and one of a constant value, a derived variable adder value and a scalar value,
where ADJUST is a signal adjust value; and
where GUARD TIME is a minimum allowable transition time.

When evaluating unperturbed slews in a balanced condition the timing test result 640 is defined as:

$$[AT_1 - AT_2 - (P_1 * SL_1) + (P_2 * SL_2) - ADJUST - GUARD\ TIME],$$

where $AT_1$ is a first arrival time on a first signal,
where $AT_2$ is a second arrival time on a second signal, where $P_1$ is a percentage of a total time of a first signal transition time to where $AT_1$ occurs along the first signal transition, defined relative to an end of the first signal transition, where $P_2$ is a percentage of a total time of a second signal transition time to where $AT_2$ occurs along the second signal transition, defined relative to a start of the second signal transition, where $SL_1$ is a first slew time on the first signal, defined as a first total transition time for the first signal, where $SL_2$ is a second slew time on the second signal, defined as a second total transition time for the second signal, where ADJUST is a signal adjust value; and where GUARD TIME is a minimum allowable transition time.

Additionally, FIG. 6 and the related above description cover a representative timing test evaluation 600, where this approach may be applied to any timing test evaluation. For example, an alternative embodiment may not include any Adjust Value or Guard Time necessary for calculation:

when evaluating perturb slews in Strong N/Weak P directions the timing test result 622 is defined as, $$[(P_1*(SL_1+X_1^-))+(P_2*(SL_2+X_2^-))];$$

when evaluating perturb slews in Weak N/Strong P directions the timing test result 632 is defined as, $$[(P_1*(SL_1+X_1^+))+(P_2*(SL_2+X_2^+))];\text{ and}$$

when evaluating unperturbed slews in a balanced condition the timing test result 642 is defined as, $$[(P_1*SL_1)+(P_2*SL_2)].$$

The timing test may further include one of a pulse width test and an inactive test, where a first signal is a trailing edge of a signal and a second signal is a leading edge of the signal, and where a rising transition and a falling transition of the first and the second signals are reversed between the pulse width test and the inactive tests.

The timing test may further include a clock gating setup test, where a first signal is a clock signal, and a second signal is a data signal, and where at least one of the first signal and the second signal may be one of rising and falling.

The timing test may further include a clock gating hold test, where a first signal is a data signal, and a second signal is a clock signal, and where at least one of the first signal and the second signal may be one of rising and falling.

Figure 7:
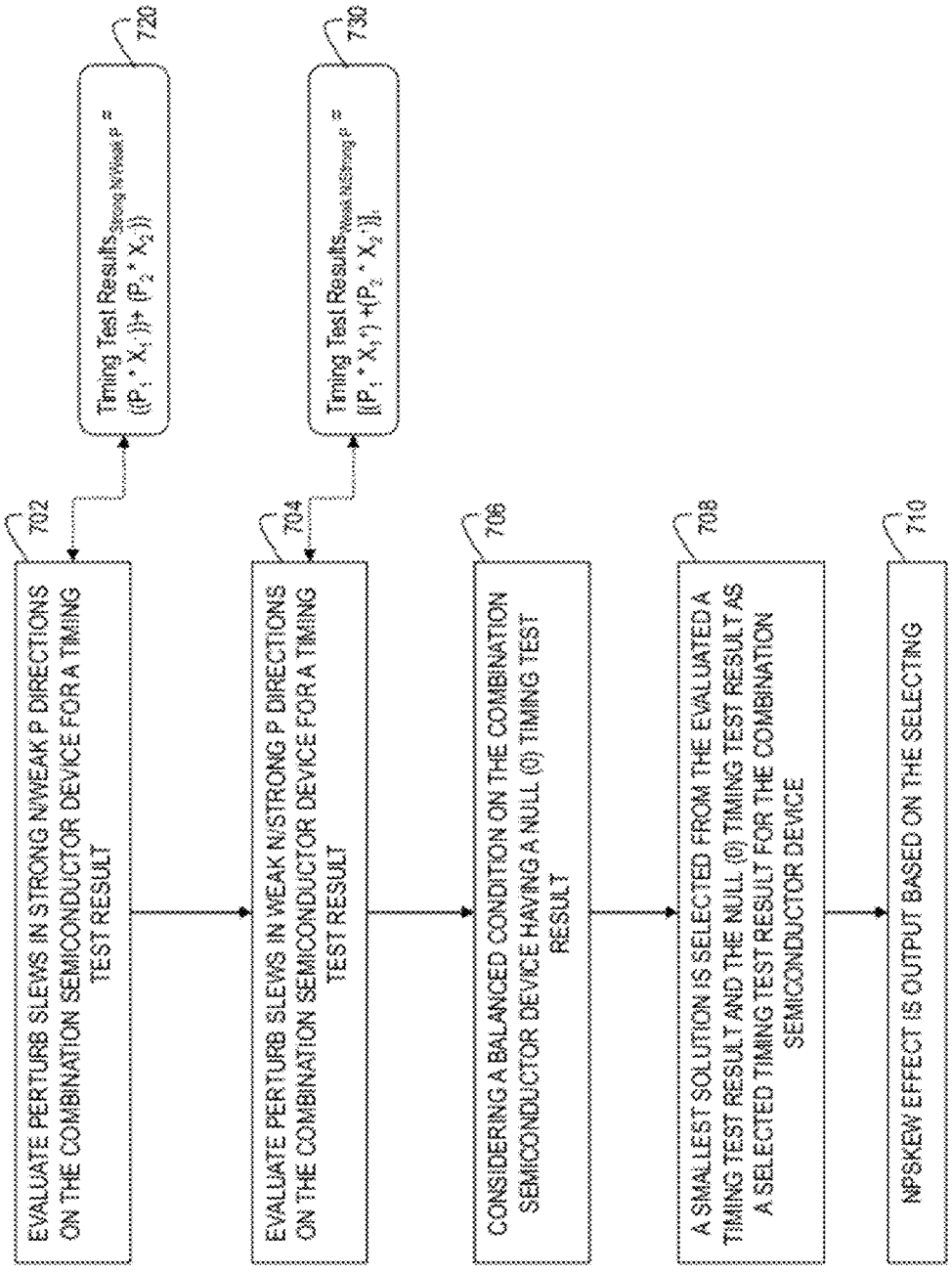
FIG. 7 illustrates a logic flowchart diagram of yet another embodiment.

FIG. 7 illustrates a logic flowchart diagram 700 of another embodiment of a computer-implemented method that simulates NPskew effects on a combination NFET (Negative Field Effect Transistor)/PFET (Positive Field Effect Transistor) semiconductor device using slew perturbations, the method includes performing a timing test by:

(1) evaluating perturb slews in Strong N/Weak P directions on the combination semiconductor device for a timing test result 702;

(2) evaluating perturb slews in Weak N/Strong P directions on the combination semiconductor device for a timing test result 704; and (3) considering a balanced condition on the combination semiconductor device having a null (0) timing test result 706.

Thereafter, a smallest solution is selected from the evaluated timing test results and the null (0) timing test result as a selected timing test result for the combination semiconductor device 708, and an NPskew effect is output based on the selecting 710.

When evaluating perturb slews in Strong N/Weak P directions the slack adjust value 720 is defined as:

$$[(P_1*X_1^-)+(P_2*X_2^-)],$$

where $P_1$ is a percentage of a total time of a first signal transition time to where a first arrival time of a first signal occurs along the first signal transition time, defined relative to an end of the first signal transition time, where $P_2$ is a percentage of a total time of a second signal transition time to where a second arrival time of a second signal is defined along the second signal transition time, defined relative to a start of the second signal transition time, where $X_1^-$ is one of a negatively signed perturbation value applied on the first slew time if the first signal transition is falling, and a positively signed perturbation value applied on the first slew time if the first signal transition is rising, where $X_1^-$ is equal to the product of the first slew time and one of a constant value, a derived variable adder value and a scalar value, and where $X_2^-$ is one of a negatively signed perturbation value applied on the second slew time if the second signal transition is falling, and a positively signed perturbation value applied on the second slew time if the second signal transition is rising, where $X_2^-$ is equal to the product of the second slew time and one of a constant value, a derived variable adder value and a scalar value.

When evaluating perturb slews in Weak N/Strong P directions the slack adjust value 730 is defined as:

$$[(P_1*X_1^+)+(P_2*X_2^+)],$$

where $P_1$ is a percentage of a total time of a first signal transition time to where a first arrival time on a first signal occurs along the first signal transition, defined relative to an end of the first signal transition, where $P_2$ is a percentage of a total time of a second signal transition time to where a second arrival time on a second signal occurs along the second signal transition, defined relative to a start of the second signal transition, where $X_1^+$ is one of a positively signed perturbation value applied on the first slew time if the first signal transition is falling, and a negatively signed perturbation value applied on the first slew time if the first transition is rising, where $X_1^+$ is equal to the product of the first slew time and one of a constant value, a derived variable adder value and a scalar value, and where $X_2^+$ is one of a positively signed perturbation value applied on the second slew time if the second signal transition is falling, and a negatively signed perturbation value applied on the second slew time if the second signal transition is rising, where $X_2^+$ is equal to the product of the second slew time and one of a constant value, a derived variable adder value and a scalar value.

An alternative embodiment is a method that simulates NPskew effects on a combination NFET (Negative Field Effect Transistor)/PFET (Positive Field Effect Transistor) semiconductor device using slew perturbations, that includes performing a timing test by a computer by evaluating, a slack adjust amount directly in a single perturbation difference equation on the combination semiconductor device for a slack adjust value, where, $$[P_1=P_2],\text{ and}$$

the ratio of $SL_1$ to $X_1^-$ is equal to a ratio of $SL_2$ to $X_2^-$, where $P_1$ is a percentage of a total time of a first signal transition time to where a first arrival time on a first signal occurs along the first signal transition, defined relative to an end of the first signal transition, where $P_2$ is a percentage of a total time of a second signal transition time to where a second arrival time on a second signal occurs along the second signal transition, defined relative to a start of the second signal transition, where $SL_1$ is a first slew time on the first signal, defined as a first total transition time for the first signal, where $SL_2$ is a second slew time on the second signal, defined as a second total transition time for the second signal, where $X_1^-$ is one of a negatively signed perturbation value applied on the first slew time if the first signal transition is falling, and a positively signed perturbation value applied on the first slew time if the first signal transition is rising, where $X_1^-$ is equal to the product of the first slew time and one of a constant value, a derived variable adder value and a scalar value, and where $X_2^-$ is one of a negatively signed perturbation value applied on the second slew time if the second signal transition is falling, and a positively signed perturbation value applied on the second slew time if the second signal transition is rising, where $X_2^-$ is equal to the product of the second slew time and one of a constant value, a derived variable adder value and a scalar value.

The above method further determines a slack adjust value according to the expression:

$$[-P*\text{ABSOLUTE VALUE}(X_1^- - X_2^-)],$$

where P is one of $P_1$ and $P_2$.

As will be appreciated by one skilled in the art, an embodiment may be embodied as a system, method or computer program product. Accordingly, another embodiment may take the form of an entirely hardware embodiment, an entirely software embodiment (including firmware, resident software, micro-code, etc.) or an embodiment combining software and hardware aspects that may all generally be referred to herein as a 'circuit,' 'module' or 'system.' Furthermore, another embodiment may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of one embodiment may be written in any combination of one or more programming languages, including an object oriented programming language such as Java, Smalltalk, C++ or the like and conventional procedural programming languages, such as the 'C' programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

An embodiment is described below with reference to flowchart illustrations and/or block diagrams of methods, apparatus (systems) and computer program products according to exemplary embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 8:
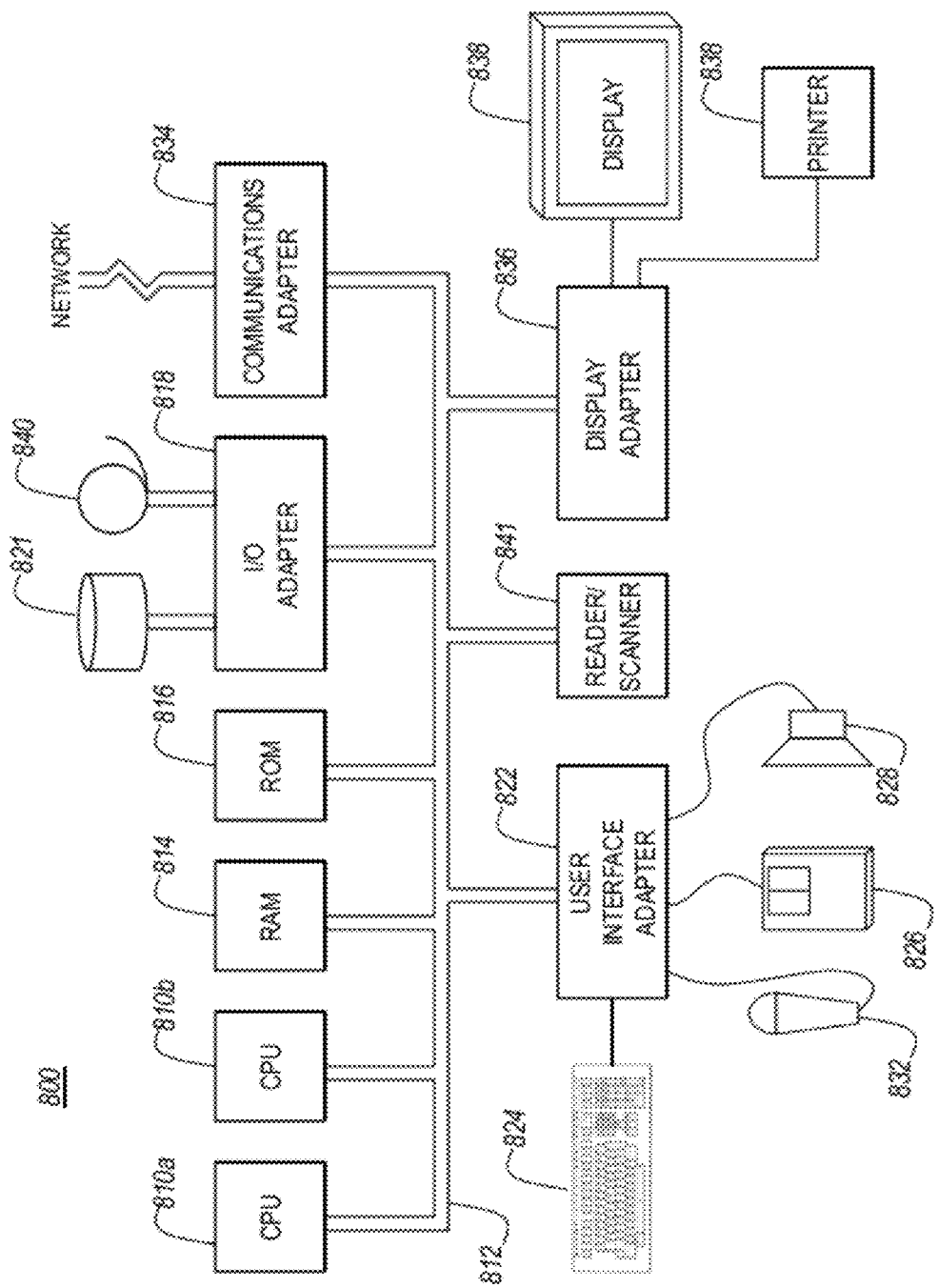
FIG. 8 illustrates a schematic diagram of a computerized device and/or computerized system for implementing methods of exemplary embodiments identified herein.

Referring now to FIG. 8, system 800 illustrates a typical hardware configuration which may be used for implementing the inventive method for performing a timing analysis of a circuit design. The configuration has preferably at least one processor or central processing unit (CPU) 810a, 810b. The CPUs 810a, 810b are interconnected via a system bus 812 to a random access memory (RAM) 814, read-only memory (ROM) 816, input/output (I/O) adapter 818 (for connecting peripheral devices such as disk units 821 and tape drives 840 to the bus 812), user interface adapter 822 (for connecting a keyboard 824, mouse 826, speaker 828, microphone 832, and/or other user interface device to the bus 812), a communication adapter 834 for connecting an information handling system to a data processing network, the Internet, and Intranet, a personal area network (PAN), etc., and a display adapter 836 for connecting the bus 812 to a display device 838 and/or printer 838. Further, an automated reader/scanner 841 may be included. Such readers/scanners are commercially available from many sources.

In addition to the system described above, a different aspect of one embodiment includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, including signal-bearing media tangibly embodying a program of machine-readable instructions executable by a digital data processor to perform the above method.

Such a method may be implemented, for example, by operating the CPU 810 to execute a sequence of machine-readable instructions. These instructions may reside in various types of signal bearing media.

Thus, this aspect of the present invention is directed to a programmed product, comprising signal-bearing media tangibly embodying a program of machine-readable instructions executable by a digital data processor incorporating the CPU 810 and hardware above, to perform one exemplary embodiment.

Whether contained in the computer server/CPU 810, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g., CD-ROM, WORM, DVD, digital optical tape, etc.), paper "punch" cards, or other suitable signal-bearing media including transmission media such as digital and analog and communication links and wireless. In an illustrative embodiment, the machine-readable instructions may comprise software object code, complied from a language such as "C," etc.

The flowchart and block diagrams in the Figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of any embodiments. As used herein, the singular forms 'a', 'an' and 'the' are intended to include the plural forms as well, unless the context clearly indicates otherwise. It will be further understood that the terms 'comprises' and/or 'comprising,' when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. This description of the embodiments has been presented for purposes of illustration and description, but is not intended to be exhaustive or limited to all the embodiments in the form disclosed. Many modifications and variations will be apparent to those of ordinary skill in the art without departing from the scope and spirit of the embodiments. The embodiments chosen and described were provided to best explain the principles of the embodiments and the practical application, and to enable others of ordinary skill in the art to understand the embodiments for various embodiments with various modifications as are suited to the particular use contemplated.

What is claimed is:

1. A computer-implemented method that simulates NPskew effects on a combination semiconductor device using slew perturbations, said combination semiconductor device comprising an NFET (Negative Field Effect Transistor)/PFET (Positive Field Effect Transistor), said method comprising:

performing a timing test comprising one of a pulse width test and an inactive test, by a computing device, by:
evaluating, by said computing device, perturbed slew times for a combination semiconductor device comprising a relatively strong NFET/relatively weak PFET, producing a first timing test result;
evaluating, by said computing device, perturbed slew times for a combination semiconductor device comprising a relatively weak NFET/relatively strong PFET, producing a second timing test result; and
evaluating, by said computing device, unperturbed slew times for a combination semiconductor device having a balanced NFET/PFET, producing a third timing test result;

determining, by said computing device, which evaluation of said perturbed and unperturbed slew times produces a timing test result having the smallest value from said first timing test result, said second timing test result and said third timing test result, for said combination semiconductor device; and outputting a NPskew effect adjusted timing test result based on said determining said timing test result having the smallest value.

2. The computer-implemented method according to claim 1, where said evaluating perturbed slew times for said combination semiconductor device comprising a relatively strong NFET/relatively weak PFET define said first timing test result as:

$$[AT_1 - AT_2 - (P_1*(SL_1+X_1)) + (P_2*(SL_2+X_2)) - \text{ADJUST} - \text{GUARD TIME}],$$

where $AT_1$ is a first arrival time on a first signal,
where $AT_2$ is a second arrival time on a second signal,
where $P_1$ is a percentage of total time of a first signal transition to where $AT_1$ occurs along the first signal transition, defined relative to an end of the first signal transition,
where $P_2$ is a percentage of total time of a second signal transition time to where $AT_2$ occurs along the second signal transition, defined relative to a start of the second signal transition,
where $SL_1$ is a first slew time on the first signal, defined as a first total transition time for the first signal, where $SL_2$ is a second slew time on the second signal, defined as a second total transition time for the second signal, where $X_1$ is one of a negatively signed perturbation value applied on the first slew time if the first signal transition is falling, and a positively signed perturbation value applied on the first slew time if the first signal transition is rising, where $X_1$ is equal to the product of the first slew time and one of a constant value, a derived variable adder value and a scalar value, where $X_2$ is one of a negatively signed perturbation value applied on the second slew time if the second signal transition is falling, and a positively signed perturbation value applied on the second slew time if the second signal transition is rising, where $X_2$ is equal to the product of the second slew time and one of a constant value, a derived variable adder value and a scalar value, where ADJUST is a signal adjust value; and where GUARD TIME is a minimum allowable transition time.

3. The computer-implemented method according to claim 1, where said perturbed slew times for said combination semiconductor device comprising a relatively weak NFET/relatively strong PFET define said second timing test result as:

$$[AT_1 - AT_2 - (P_1*(SL_1+X_1)) + (P_2*(SL_2+X_2)) - \text{ADJUST} - \text{GUARD TIME}],$$

where $AT_1$ is a first arrival time on a first signal, where $AT_2$ is a second arrival time on a second signal, where $P_1$ is a percentage of a total time of a first signal transition time to where $AT_1$ occurs along the first signal transition, defined relative to an end of the first signal transition, where $P_2$ is a percentage of a total time of a second signal transition time to where $AT_2$ occurs along the second signal transition, defined relative to a start of the second signal transition, where $SL_1$ is a first slew time on the first signal, defined as a first total transition time for the first signal, where $SL_2$ is a second slew time on the second signal, defined as a second total transition time for the second signal, where $X_1$ is one of a positively signed perturbation value applied on the first slew time if the first signal transition is falling, and a negatively signed perturbation value applied on the first slew time if the first transition is rising, where $X_1$ is equal to the product of the first slew time and one of a constant value, a derived variable adder value and a scalar value, where $X_2$ is one of a positively signed perturbation value applied on the second slew time if the second signal transition is falling, and a negatively signed perturbation value applied on the second slew time if the second signal transition is rising, where $X_2$ is equal to the product of the second slew time and one of a constant value, a derived variable adder value and a scalar value, where ADJUST is a signal adjust value; and where GUARD TIME is a minimum allowable transition time.

4. The computer-implemented method according to claim 1, where said evaluating unperturbed slew times for said combination semiconductor device having a balanced NFET/PFET define said third timing test result as:

$$[AT_1 - AT_2 - (P_1*SL_1) + (P_2*SL_2) - \text{ADJUST} - \text{GUARD TIME}],$$

where $AT_1$ is a first arrival time on a first signal, where $AT_2$ is a second arrival time on a second signal, where $P_1$ is a percentage of a total time of a first signal transition time to where $AT_1$ occurs along the first signal transition, defined relative to an end of the first signal transition, where $P_2$ is a percentage of a total time of a second signal transition time to where $AT_2$ occurs along the second signal transition, defined relative to a start of the second signal transition, where $SL_1$ is a first slew time on the first signal, defined as a first total transition time for the first signal, where $SL_2$ is a second slew time on the second signal, defined as a second total transition time for the second signal, where ADJUST is a signal adjust value; and where GUARD TIME is a minimum allowable transition time.

5. The computer-implemented method according to claim 1, where said evaluating perturbed slew times for said combination semiconductor device comprising a relatively strong NFET/relatively weak PFET define said first timing test result as:

$$[(P_1*(SL_1+X_1)) + (P_2*(SL_2+X_2))],$$

where $P_1$ is a percentage of a total time of a first signal transition time to where a first arrival time on a first signal occurs along the first signal transition, defined relative to an end of the first signal transition, where $P_2$ is a percentage of a total time of a second signal transition time to where a second arrival time on a second signal occurs along the second signal transition, defined relative to a start of the second signal transition, where $SL_1$ is a first slew time on the first signal, defined as a first total transition time for the first signal, where $SL_2$ is a second slew time on the second signal, defined as a second total transition time for the second signal, where $X_1$ is one of a negatively signed perturbation value applied on the first slew time if the first signal transition is falling, and a positively signed perturbation value applied on the first slew time if the first signal transition is rising, where $X_1$ is equal to the product of the first slew time and one of a constant value, a derived variable adder value and a scalar value, and where $X_2$ is one of a negatively signed perturbation value applied on the second slew time if the second signal transition is falling, and a positively signed perturbation value applied on the second slew time if the second signal transition is rising, where $X_2$ is equal to the product of the second slew time and one of a constant value, a derived variable adder value and a scalar value.

6. The computer-implemented method according to claim 1, where said perturbed slew times for said combination semiconductor device comprising a relatively weak NFET/relatively strong PFET define said second timing test result as:

$$[(P_1*(SL_1+X_1)) + (P_2*(SL_2+X_2))],$$

where $P_1$ is a percentage of a total time of a first signal transition time to where a first arrival time on a first signal occurs along the first signal transition, defined relative to an end of the first signal transition, where $P_2$ is a percentage of a total time of a second signal transition time to where a second arrival time on a second signal occurs along the second signal transition, defined relative to a start of the second signal transition, where $SL_1$ is a first slew time on the first signal, defined as a first total transition time for the first signal, where $SL_2$ is a second slew time on the second signal, defined as a second total transition time for the second signal, where $X_1$ is one of a positively signed perturbation value applied on the first slew time if the first signal transition is falling, and a negatively signed perturbation value applied on the first slew time if the first transition is rising, where $X_1$ is equal to the product of the first slew time and one of a constant value, a derived variable adder value and a scalar value, and where $X_2$ is one of a positively signed perturbation value applied on the second slew time if the second signal transition is falling, and a negatively signed perturbation value applied on the second slew time if the second signal transition is rising, where $X_2$ is equal to the product of the first slew time and one of a constant value, a derived variable adder value and a scalar value.

7. The computer-implemented method according to claim 1, where said evaluating unperturbed slew times for said combination semiconductor device having a balanced NFET/PFET define said third timing test result as:

$$[(P_1*SL_1)+(P_2*SL_2)],$$

where $AT_1$ is a first arrival time on a first signal,
where $AT_2$ is a second arrival time on a second signal,
where $P_1$ is a percentage of a total time of a first signal transition time to where $AT_1$ occurs along the first signal transition, defined relative to an end of the first signal transition,
where $P_2$ is a percentage of a total time of a second signal transition time to where $AT_2$ occurs along the second signal transition, defined relative to a start of the second signal transition,
where $SL_1$ is a first slew time on the first signal, defined as a first total transition time for the first signal, and
where $SL_2$ is a second slew time on the second signal, defined as a second total transition time for the second signal.

8. The computer-implemented method according to claim 1,
where a first signal is a trailing edge of a signal and a second signal is a leading edge of said signal, and
where a rising transition and a falling transition of said first and said second signals are reversed between said pulse width test and said inactive test.

9. The computer-implemented method according to claim 1, where said timing test further comprises a clock gating setup test,
where a first signal is a clock signal, and a second signal is a data signal, and
where at least one of said first signal and said second signal may be one of rising and falling.

10. The computer-implemented method according to claim 1, where said timing test further comprises a clock gating hold test,
where a first signal is a data signal, and a second signal is a clock signal, and
where at least one of said first signal and said second signal may be one of rising and falling.

11. A computer-implemented method that simulates NPskew effects on a combination semiconductor device using slew perturbations, said combination semiconductor device comprising an NFET (Negative Field Effect Transistor)/PFET (Positive Field Effect Transistor), said method comprising:
performing a timing test by a computing device by:
evaluating, by said computing device, perturbed slew times for a combination semiconductor device comprising a relatively strong NFET/relatively weak PFET, producing a first timing test result;
evaluating, by said computing device, perturbed slew times for a combination semiconductor device comprising a relatively weak NFET/relatively strong PFET, producing a second timing test result;
selecting, by said computing device, one of said first timing test result, said second timing test result, and a null (0) timing test result having a smallest value as a selected timing test result for said combination semiconductor device; and
outputting a NPskew effect based on said selecting.

12. The computer-implemented method according to claim 11, where said evaluating perturbed slew times for said combination semiconductor device comprising a relatively strong NFET/relatively weak PFET define a slack adjust value as:

$$[(P_1*X_1)+(P_2*X_2)],$$

where $P_1$ is a percentage of a total time of a first signal transition time to where a first arrival time of a first signal occurs along the first signal transition time, defined relative to an end of the first signal transition time,
where $P_2$ is a percentage of a total time of a second signal transition time to where a second arrival time of a second signal is defined along the second signal transition time, defined relative to a start of the second signal transition time,
where $X_1$ is one of a negatively signed perturbation value applied on a first slew time if the first signal transition is falling, and a positively signed perturbation value applied on the first slew time if the first signal transition is rising, where $X_1$ is equal to the product of the first slew time and one of a constant value, a derived variable adder value and a scalar value, and
where $X_2$ is one of a negatively signed perturbation value applied on a second slew time if the second signal transition is falling, and a positively signed perturbation value applied on the second slew time if the second signal transition is rising, where $X_2$ is equal to the product of the second slew time and one of a constant value, a derived variable adder value and a scalar value.

13. The computer-implemented method according to claim 11, where said perturbed slew times for said combination semiconductor device comprising a relatively weak NFET/relatively strong PFET define a slack adjust value as:

$$[(P_1*X_1)+(P_2*X_2)],$$

where $P_1$ is a percentage of a total time of a first signal transition time to where a first arrival time on a first signal occurs along the first signal transition, defined relative to an end of the first signal transition,
where $P_2$ is a percentage of a total time of a second signal transition time to where a second arrival time on a second signal occurs along the second signal transition, defined relative to a start of the second signal transition,
where $X_1$ is one of a positively signed perturbation value applied on a first slew time if the first signal transition is falling, and a negatively signed perturbation value applied on the first slew time if the first transition is rising, where $X_1$ is equal to the product of the first slew time and one of a constant value, a derived variable adder value and a scalar value, and
where $X_2$ is one of a positively signed perturbation value applied on a second slew time if the second signal transition is falling, and a negatively signed perturbation value applied on the second slew time if the second signal transition is rising, where $X_2$ is equal to the product of the second slew time and one of a constant value, a derived variable adder value and a scalar value.

14. The computer-implemented method according to claim 11, where said timing test further comprises one of a pulse width test and an inactive test, where a first signal is a trailing edge of a signal and a second signal is a leading edge of said signal, and where a rising transition and a falling transition of said first and said second signals are reversed between said pulse width test and said inactive test.

15. The computer-implemented method according to claim 11, where said timing test further comprises a clock gating setup test, where a first signal is a clock signal, and a second signal is a data signal, and where at least one of said first signal and said second signal may be one of rising and falling.

16. The computer-implemented method according to claim 11, where said timing test further comprises a clock gating hold test, where a first signal is a data signal, and a second signal is a clock signal, and where at least one of said first signal and said second signal may be one of rising and falling.

17. A computer-implemented method that simulates NPskew effects on a combination semiconductor device using slew perturbations, said combination semiconductor device comprising an NFET (Negative Field Effect Transistor)/PFET (Positive Field Effect Transistor), said method comprising:

performing a timing test by a computer by evaluating a slack adjust amount in a single perturbation on said combination semiconductor device, producing a slack adjust value defined as $[(P_1*(SL_1+X_1))+(P_2*(SL_2+X_2))]$, where $P_1$ is equal in value to $P_2$, and the ratio of $SL_1$ to $X_1$ is equal in value to the ratio of $SL_2$ to $X_2$, where $P_1$ is a percentage of a total time of a first signal transition time to where a first arrival time on a first signal occurs along the first signal transition, defined relative to an end of the first signal transition, where $P_2$ is a percentage of a total time of a second signal transition time to where a second arrival time on a second signal occurs along the second signal transition, defined relative to a start of the second signal transition, where $SL_1$ is a first slew time on the first signal, defined as a first total transition time for the first signal, where $SL_2$ is a second slew time on the second signal, defined as a second total transition time for the second signal, where $X_1$ is one of a negatively signed perturbation value applied on the first slew time if the first signal transition is falling, and a positively signed perturbation value applied on the first slew time if the first signal transition is rising, where $X_1$ is equal to the product of the first slew time and one of a constant value, a derived variable adder value and a scalar value, and where $X_2$ is one of a negatively signed perturbation value applied on the second slew time if the second signal transition is falling, and a positively signed perturbation value applied on the second slew time if the second signal transition is rising, where $X_2$ is equal to the product of the second slew time and one of a constant value, a derived variable adder value and a scalar value.

18. The computer-implemented method according to claim 17, further comprising:

determining a slack adjust value according to the expression:

$$[-P*\text{ABSOLUTE VALUE}(X_1-X_2)],$$

where P is one of $P_1$ and $P_2$.

19. The computer-implemented method according to claim 17, where said timing test further comprises one of a pulse width test and an inactive test, where a first signal is a trailing edge of a signal and a second signal is a leading edge of said signal, and where a rising transition and a falling transition of said first and said second signals are reversed between said pulse width test and said inactive test.

20. The computer-implemented method according to claim 17, where said timing test further comprises a clock gating setup test, where a first signal is a clock signal, and a second signal is a data signal, and where at least one of said first signal and said second signal may be one of rising and falling.

21. The computer-implemented method according to claim 17, where said timing test further comprises a clock gating hold test, where a first signal is a data signal, and a second signal is a clock signal, and where at least one of said first signal and said second signal may be one of rising and falling.

* * * * *